United States Patent [19]

Gominho et al.

[11] Patent Number: 5,081,590
[45] Date of Patent: Jan. 14, 1992

[54] COMPUTER AIDED TECHNIQUE FOR POST PRODUCTION TUNING OF MICROWAVE MODULES

[75] Inventors: Emanuel C. Gominho, Columbia; Alfred W. Morse, Ellicott City, both of Md.

[73] Assignee: Westinghouse Electric Corp., Pittsburgh, Pa.

[21] Appl. No.: 520,967

[22] Filed: May 10, 1990

Related U.S. Application Data

[63] Continuation-in-part of Ser. No. 161,648, Feb. 29, 1988, abandoned.

[51] Int. Cl.[5] .................................... G01R 35/00
[52] U.S. Cl. .............................. 364/481; 358/903; 364/474.08; 437/8
[58] Field of Search ............ 364/553, 580, 570, 474.16, 364/474.08, 474.01, 472, 468, 481; 358/903; 330/2; 437/908, 907, 8

[56] References Cited

U.S. PATENT DOCUMENTS

| | | | |
|---|---|---|---|
| T940,013 | 11/1975 | Ho . | |
| 3,725,685 | 4/1973 | Bourgoin et al. | 364/468 |
| 3,824,678 | 7/1974 | Harris et al. | 437/182 |
| 4,025,873 | 5/1977 | Chilluffo | 330/277 |
| 4,172,741 | 10/1979 | Johnson | 437/19 |
| 4,189,778 | 2/1980 | Vogel | 364/482 |
| 4,246,535 | 1/1981 | Huang et al. | 324/602 |
| 4,300,196 | 11/1981 | Lopresti | 364/489 |
| 4,404,635 | 9/1983 | Flaker | 364/481 |
| 4,510,454 | 4/1985 | Sherman | 330/2 |
| 4,556,841 | 12/1985 | Carlson | 324/73.1 |
| 4,578,761 | 3/1986 | Gray | 364/481 |
| 4,593,820 | 6/1986 | Antonie et al. | 209/573 |
| 4,605,893 | 8/1986 | Braslau | 324/642 |
| 4,970,600 | 11/1990 | Garnier et al. | 364/474.08 X |

FOREIGN PATENT DOCUMENTS 0127103 12/1983 Japan .

Primary Examiner—Thomas G. Black
Assistant Examiner—S. A. Melnick
Attorney, Agent, or Firm—W. G. Sutcliff

[57] ABSTRACT

A method and apparatus which incorporates an optimization gradient algorithm for post production tuning of a microstrip microwave amplifier. The tuning technique replaces conventional time consuming manual post production tuning techniques and comprises a computerized technique which is operable to test the amplifier for its response characteristics, perturb circuit matching elements and measure the response as a result of the perturbations, and thereafter effect the required change in the circuit's tuning elements to bring the circuit response in conformance with a desired value. Perturbation is accomplished by robotic placement of dielectric chips on the matching elements while tuning is accomplished by either computer controlled laser trimming of the lengths of the tuning elements or robotic application of metallization to the tuning elements for increasing their respective lengths.

22 Claims, 13 Drawing Sheets

COMPUTER AIDED TECHNIQUE FOR POST PRODUCTION TUNING OF MICROWAVE MODULES

CROSS REFERENCE TO RELATED APPLICATION

This application is a continuation-in-part application of U.S. Ser. No. 07/161,648,, filed Feb. 29, 1988 abandoned.

BACKGROUND OF THE INVENTION

1. Field of the Invention

The present invention relates to a computer implemented, post production, lumped element or microstrip tuning method which relies on actual measurements of circuit parameters and on a priori knowledge of a specific circuit's desired response characteristics.

2. Description of the Prior Art

The tuning of an electrical circuit in the post production stage currently requires extensive human interface and intervention. A highly trained, skilled technician must individually test and tune each element of the circuit under test to achieve an ideal or specified circuit performance.

This manual post production tuning process is expensive because of the man-hour intensive, concentrated efforts required to reach circuit optimization. A skilled technician testing either lumped circuit elements such as resistors and capacitors or microwave, microstrip hybrid micro-electronic devices utilizes the same test and tune iterations striving towards ideal circuit performance.

First, the technician must test the circuit to be tuned in order to ascertain the circuit's existing level of performance. Next he must produce some physical change in the circuit elements, called a perturbation, one at a time. This individual element change will result in overall system performance change which is registered the second time the overall circuit performance is checked. Obviously, this time consuming circuit optimization process when performed for a circuit having a multiplicity of elements requires many man-hours of testing and tuning. Further, these time consuming circuit element adjustments require skilled technicians painstakingly probing the circuit under test and empirically determining the optimum element combinations necessary to cancel the myriad of effects of individual manufacturing and component tolerances.

The problem to be solved then is the development of a post production testing and tuning method which requires minimum human intervention and which can be fully automated. This method must be operable with lumped element circuits as well as microwave microstrip circuits. Specifically, this method will utilize the physical perturbation of individual circuit elements in concert with a mathematical optimization algorithm to achieve overall optimum circuit response.

Microwave amplifier modules usually require post production tuning to meet all technical specifications. These time consuming circuit adjustments are now presently performed by skilled technicians who again must painstakingly probe the circuit and empirically determine the optimum tuning combinations.

Computer-aided design and manufacturing of microwave modules has resulted in more uniform circuits by careful design analysis and control of these critical tolerances. However, these aids in design and manufacture do not totally preclude the necessity of post production tuning.

In order to reduce the skill requirements of the operators involved in the post production tuning process of microwave amplifiers, and thereby also reduce production costs a need has developed to apply computer based techniques to post production tuning of microwave amplifiers.

The automated post production tuning problem has been traditionally approached as a mathematical optimization problem. A computer model of the circuit to be tuned is created and the actual circuit parameters are then measured. The ideal computer generated response of the circuit is then related to the actual circuit response and a tuning algorithm is developed. This algorithm is a linear approximation of the circuit performance function. It updates the actual network tuning element configurations based on gradient data obtained by computer simulation of the network performance response to small changes in the tuning element values.

The traditional technique presupposes that a comprehensive computer model of the circuit can be realized. When one cannot rigorously define a transfer function for the network, it is not possible to construct such a computer model, and consequently the technique cannot be used. Such is the case for amplifiers which operate in saturation. Moreover, for all but the most simple microwave circuits, which have minimal tuning time requirements, it is not practical to construct an exhaustive computer model and an effective approximation algorithm which can provide enough information to tune an actual circuit.

The problem to be solved then for the post production tuning of microwave amplifiers is the development of a post production tuning technique which is hardware oriented and does not rely solely on information from a computer model of the circuit to be tuned. It would be an advantage for the computer model to be independent of the network transfer function, and based upon measurements of the actual circuit performance parameters. Knowledge of actual circuit performance parameters would utilize the circuit designer's knowledge of the basic circuit response characteristics to best advantage. It would further be an advantage to develop a post production tuning technique wherein the gradient algorithm used is not a purely mathematical construct, but a flexible formula which receives hardware dependent inputs specified by the circuit designer.

Finally, a fully automated, computer controlled, post production tuning station would most fully realize a significant cost reduction in post production processing. The elimination of the hands-on human interface by highly skilled technicians would decrease post production tuning time and therefore costs.

SUMMARY OF THE INVENTION

Briefly, this invention is directed to a method and apparatus which incorporates an optimization gradient algorithm with hardware oriented individual circuit element perturbations, striving toward circuit performance optimization as specified by the circuit performance requirements. The preferred embodiment of this tuning method comprises a computer aided post production tuning technique for solid state, microstrip, microwave amplifiers. This tuning technique replaces the time consuming manual post production tuning techniques now practiced. This computer aided technique is operable for use with open or shorted microstrip tuning stubs, wherein the electrical perturbation of one end of the microstrip amplifier stub causes a resultant measurable, physical change in stub length. A computer controlled robotics station effecting matching element perturbation and a laser effecting trimming of the amplifier microstrip tuning elements is disclosed whereby the optimization algorithm combined with measured, individual, robotic actuated circuit element perturbations achieve fully automated post production tuning of microstrip amplifiers with a minimum of human intervention.

The preferred embodiment accordingly is characterized by a computer enhanced tuning and testing method which optimizes towards any measurable objective function using physical element perturbation and an optimization algorithm. This method is based upon input data resulting from real-time testing and alteration of an electrical circuit, a stored knowledge base reflecting the actual circuit design and design signal response, prior tuning history, and output data in the form of physical correction predictions as calculated by a gradient based optimal seeking algorithm. The preferred embodiment of this invention utilizes a tuning element configuration applicable to both open and shorted stubs of stripline microwave amplifiers. A fully automated, computer controlled, post production tuning station is disclosed which eliminates time consuming, expensive hands-on circuit testing and tuning by highly skilled technicians.

BRIEF DESCRIPTION OF THE DRAWINGS

For a better understanding of the invention, reference may be had of the preferred embodiment exemplary of the invention shown in the accompanying drawings, in which.

DESCRIPTION OF THE PREFERRED EMBODIMENTS

Figure 1:
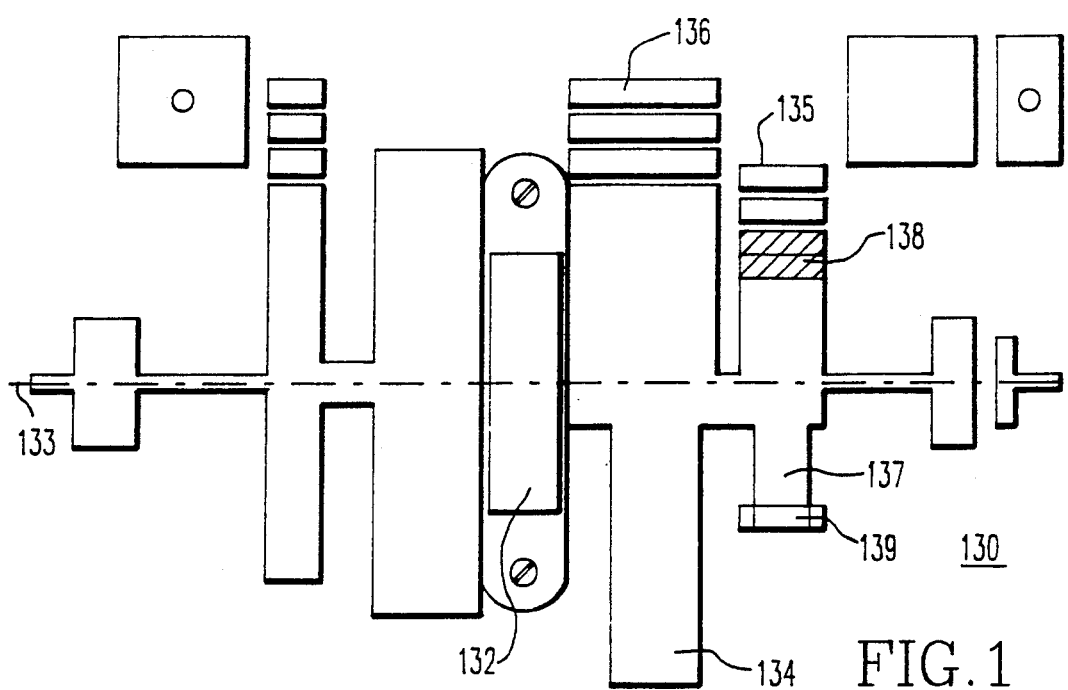
FIG. 1 is a plan view of a microwave amplifier device under test having both open and shorted stubs.

FIG. 1 is a typical example of a type of device, a microstrip amplifier 130, which could utilize the test and tune method to be described. In FIG. 1 the device under test (DUT) is a microwave microstrip amplifier 130 having a transistor 132 with attached microstrip stub circuitry 134. The radio frequency input/output center line 133 bisects the device 130. Tuning pads 136 are shown opposite the stub circuitry 134. The Open stub tuning side 135 of this device 130 has an open stub perturbation side 137 directly opposing it, balanced about the radio frequency center line 133. Metallization in the form of Indium foil 138 is shown extending the open stub tuning side 135 in compensation for a dielectric chip 139 shown resting upon the end of the perturbation side 137 of the open stub.

Figure 2:
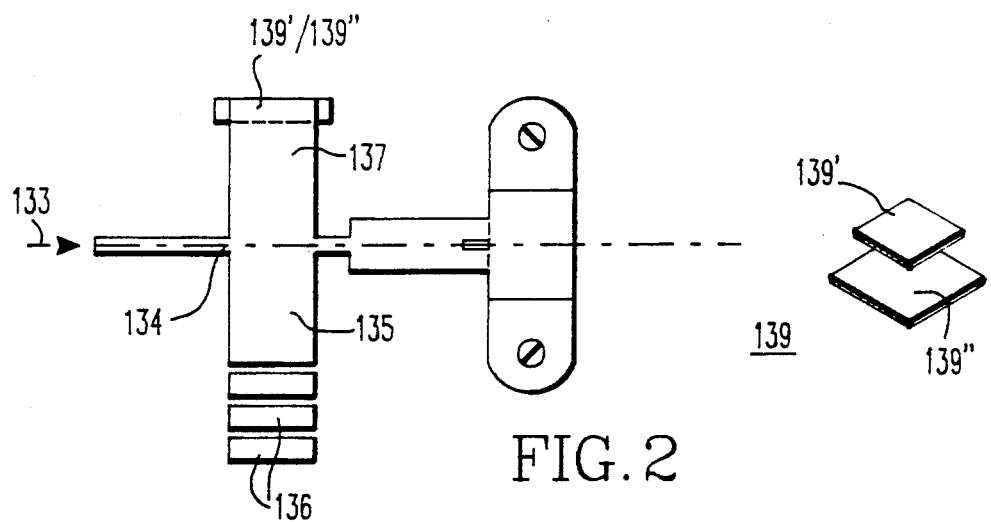
FIG. 2 is a plan view of a tuning element configuration utilizing open stub tuning elements, specifically dielectric chip placements.

FIG. 2 is a detail of the open stub tuning side 135 and the open stub perturbation side 137 of the microstrip stub material 134 of the device under test 130. This open stub tuning method utilizes either of two dielectric chips 139 shown by reference numerals 139' and 139". A first dielectric chip 139' of a predetermined size is placed upon the perturbation stub 137. A measurement is made of the change in the length of the tuning side 135 necessary after the placement of the first dielectric chip 139' of a predetermined size, on the open end or perturbation side 137 of the open stub 134. An overall circuit response perturbation occurs by placing, the small dielectric chip 139' upon the perturbation side 137 of the microstrip stubs 134. The stub loading effect of this chip 139' on the overall circuit performance is translated into the addition of a certain physical length to the tuning stub 135 on the opposite side of the stub. A second perturbation using a slightly larger dielectric chip 139", provides for, using the appropriate error calculations a second order gradient information of the circuit response. The equivalency between the addition of tuning stub 135, length and the dielectric chip 139', 139" size is realized by the circuit designer in the bread boarding phase by measuring the respective effects on overall circuit response and relating the two distinct sets of data for each circuit tuning element.

Figure 2A:
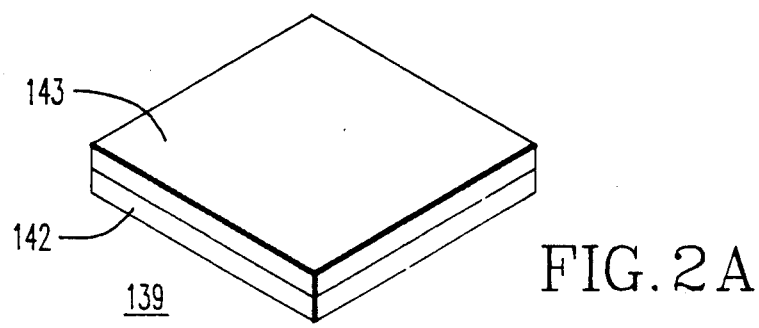
FIG. 2a is an orthogonal view of a multilayer dielectric chip.

FIG. 2A is an orthogonal view of a multilayer dielectric chip 139 as it is used to perturbate the open end or perturbation side 137 of open stub 134. This multilayer dielectric chip comprises an aluminum oxide layer 142, with a metallized top surface 143.

Figure 3:
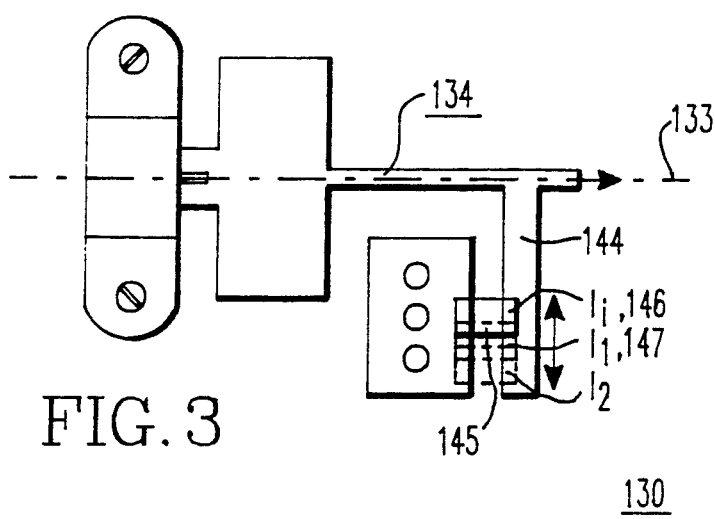
FIG. 3 is a plan view of a tuning element configuration utilizing a shorted stub tuning element, specifically the placement of a capacitor to ground placement.

FIG. 3 is an extension of this optimization tuning technique as applied to shorted stub tuning elements. In FIG. 3 a device 130 is shown with detail and enlargement of a shorted tuning stub 144. The microstrip 134 is balanced about the input/output radio frequency line 133. To effects a perturbation of the shorted stub 134 the chip capacitor 145 is moved a predetermined distance $l_i$ along the tuning portion of the stub 144. The chip capacitor 145 is used to bypass the stub 144 to ground and thus effectively terminate the stub 144. By sliding the capacitor 145 along the stub 144 the effective length of the shorted stub 134 is changed to provide the appropriate tuning range. This first movement of the capacitor along the tuning portion is then the "standard tuning element" $l_i$. Then the required (for the algorithm) first and second order perturbations are created by sliding the capacitor 145 two very small discrete $l_1$ and $l_2$ distances 146, 147 respectively in one chosen direction.

Figure 4:
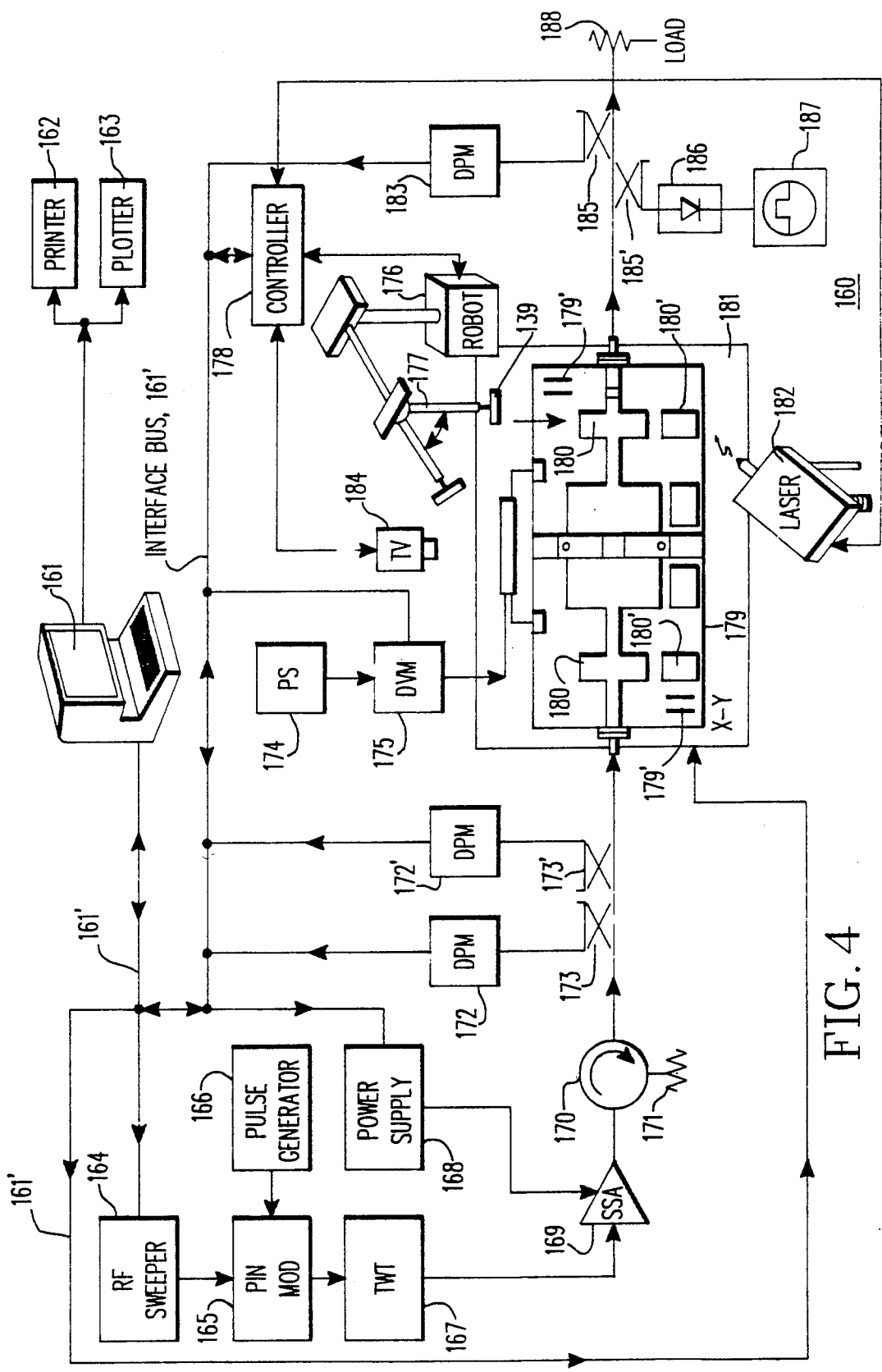
FIG. 4 is a plan view of a fully automated, computer controlled test/tune station.
Figure 4A:
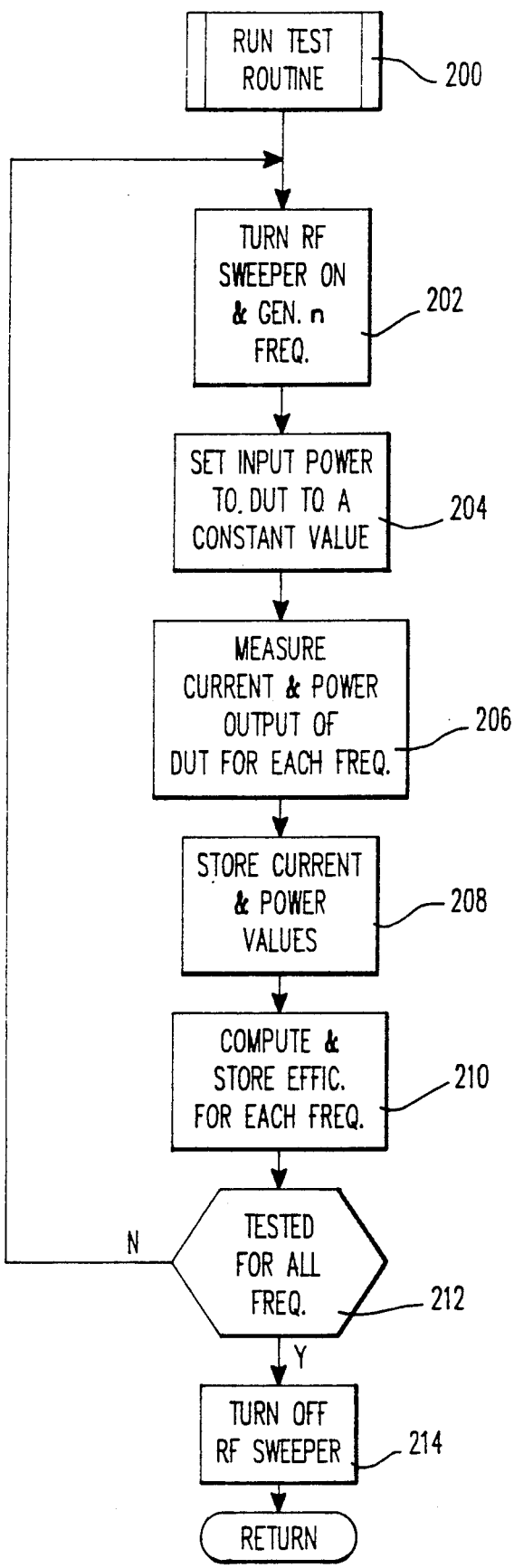
FIG. 4A is a flowchart generally illustrative of the test operation implemented at the station shown in FIG. 4.
Figure 4B:
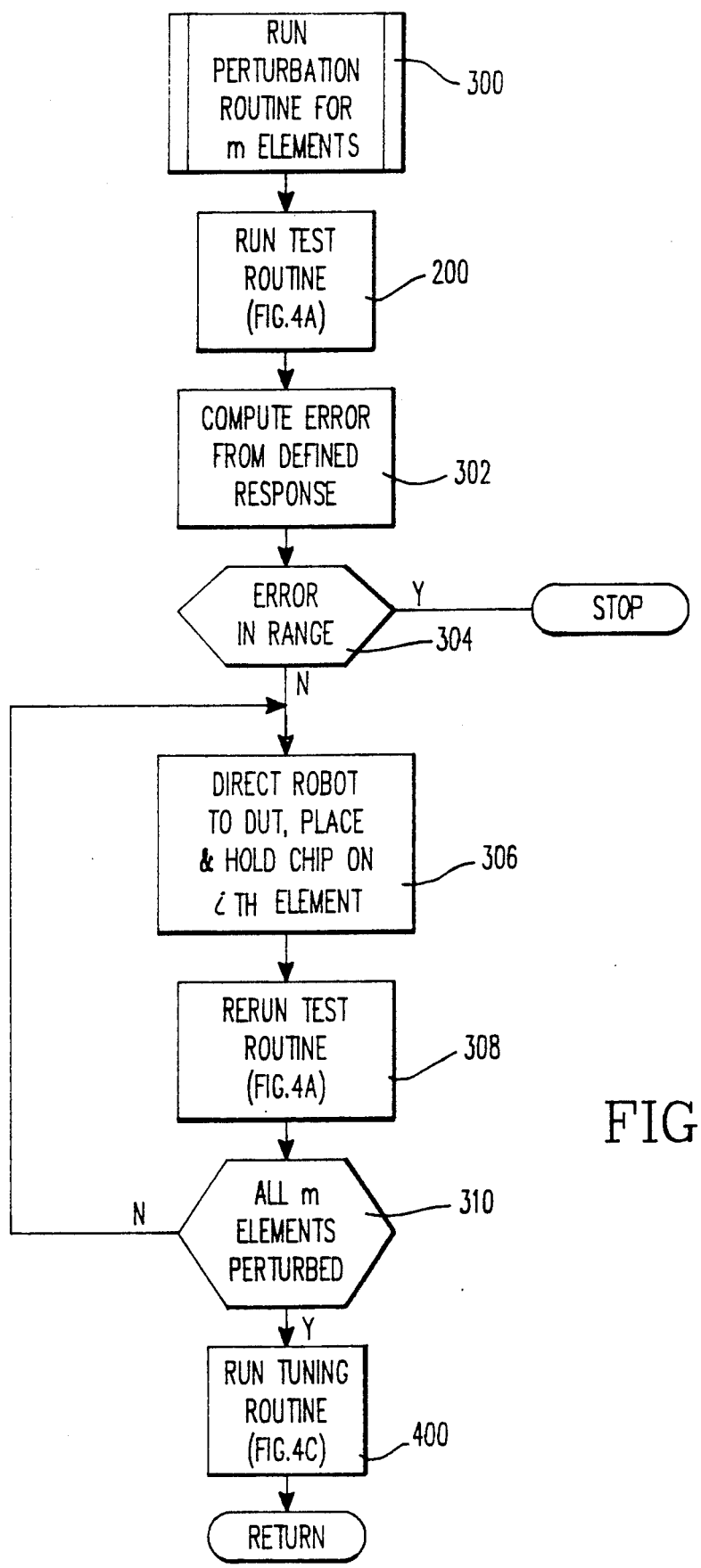
FIG. 4B is a flowchart generally illustrative of the perturbation operation implemented at the station shown in FIG. 4.
Figure 4C:
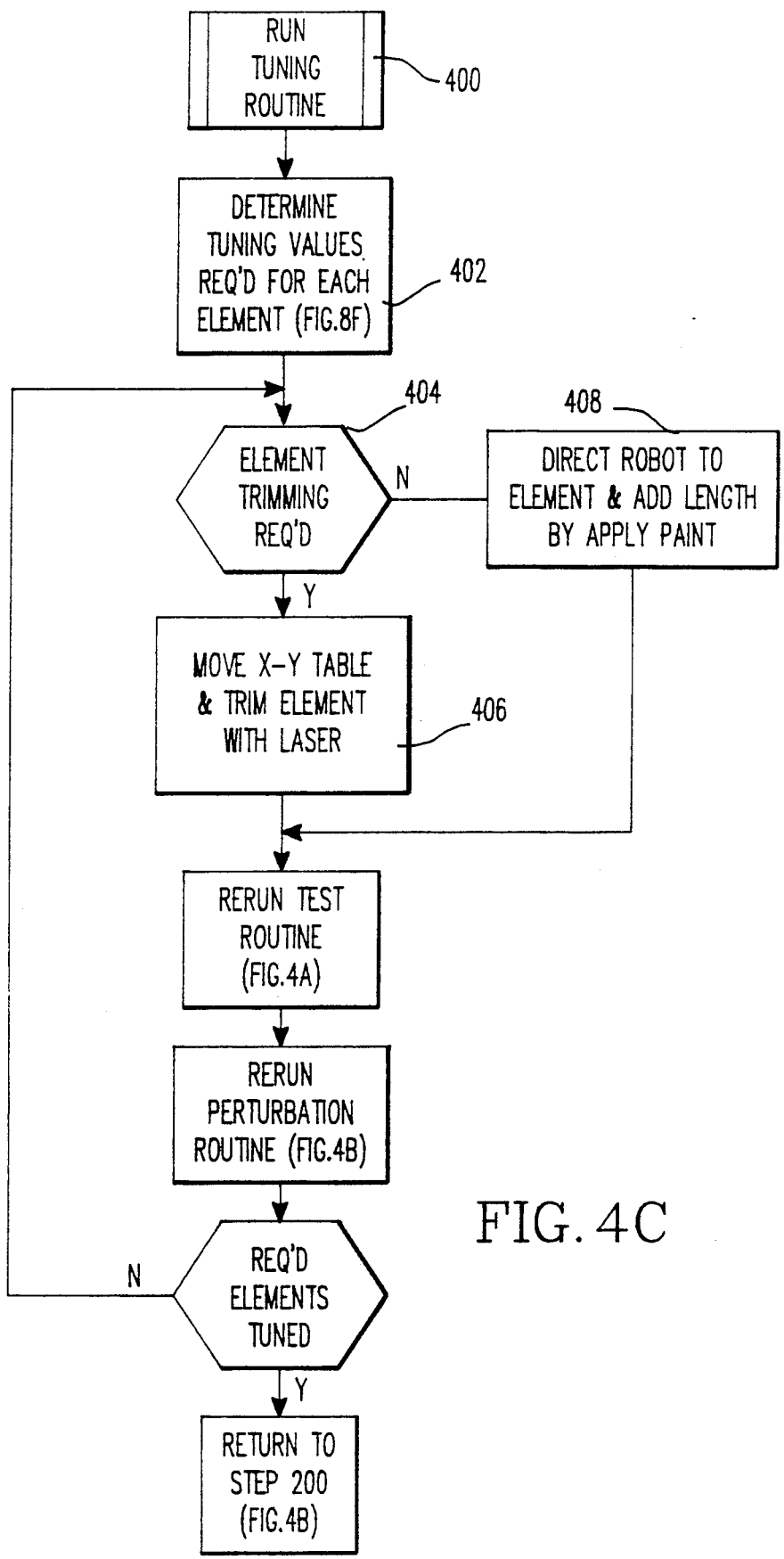
FIG. 4C is a flowchart generally illustrative of the tuning operation implemented at the station shown in FIG. 4.

FIG. 4 is a plan view generally illustrative of a fully automated, computer controlled test/tune station in accordance with this invention. The entire testing and tuning process or method 10, generally shown in FIGS. 4A-4C, is performed under the direction of computer 161 with integrated peripherals including a printer 162 and plotter 163.

The computer 161 comprises, for example, a Hewlett Packard Model 330C Work Station driven by HR E20-00A/2001 software and utilizing an Oracle Database Package for IBM PC/AT personal computers for data storage and using "C" language. The computer 161 is connected to the remainder of the apparatus shown in FIG. 4 through a bidirectional digital interface bus 161' which is known generically as an IEEE 488 interface bus. It is connected to a radio frequency (RF) sweeper 164 which generates a plurality (n) of radio frequency signals. The RF sweeper 164 sends a continuous wave (CW) radio frequency signal to a modulator 165 which is, in this example, a PIN Diode. The modulator 165 also receives from a pulse generator 166 a pulsed video pulse which allows it to pulse the RF signal accordingly. The pulsed RF is sent to a travelling wave tube (TWT) amplifier 167. The TWT sends an amplified, pulsed signal to a second level amplification stage, comprising a solid state amplifier (SSA) 169. This SSA 169 is powered from a power supply 168 which is controlled by the computer 161 via the interface bus 161'. The second stage amplified signal enters a circulator 170 with attached "dummy" resistance load 171. This circulator 170 with attendant resistance load 171 guarantees that the signal received from the second solid state amplifier 169 is maintained at 50Ω. Digital power meters 172, 172' are coupled into the radio frequency line with couplers 173, 173'. The couplers 173, 173' couple off the power to the digital power meters 172, 172' where incident power into DUT 179 and the reflected signal power are measured, respectively. The DUT 179 is positioned on a movable x-y table 181. The DUT 179 includes exposed stub circuit elements 180 and 180' and receives the radio frequency signal from the circulator 170. The DUT 179 receives DC power from an outside power source 174. During the testing, perturbing and tuning processes to be subsequently described, a digital current measuring circuit 175 measures the current and transmits the measurement data back to computer 161 via the interface bus 161' so that the efficiency of the DUT 179 can be calculated by the computer A robot 176 including a robotic arm 177 is shown positioned adjacent the x-y table and operates in response to a controller 178 which is coupled to the computer 161 through the interface bus 161'. Also located adjacent the x-y table 181 is a laser device 182 and a video camera 184 which are linked by the controller 178 to the robot 176. The robot 176, the controller 178 and video camera are part of a commercially available robotic system, typically an Automatix Robuvision 600 Vision Guided Robotic System. The laser comprises, for example, a Control Laser Model 612 Q-switched pulse YAG laser also commercially available.

The robot operates to selectively place a dielectric chip 139 on one of the matching circuit elements 180 of the unit under test 179 as it lies on the x-y table 181 or add metallization to one of the tuning elements 180' while the laser operates to trim a turning element 180', as will be described hereinafter. A third digital power meter 183 and coupler 184 reads the RF signal at the output of the DUT 179, while a second output coupler 184' attached to diode 186 converts the exiting RF signal to a voltage which can be viewed on an oscilloscope 187. A "Dummy" resistance load 188 receives all the remaining RF power while terminating the circuit with a 50Ω load. Printer 162 and plotter 163 plot the tested frequency, output power, input power, VSWR, reflected power and current.

Considering now the operation of the embodiment of the invention shown in FIG. 4, three separate functions take place under control of the computer 161. First, the DUT 179 is tested, which consists of measuring the power output and the current drawn by the DUT 179 under a constant input power level. Then the response of the DUT 179 is measured when it is subjected to a physical interaction, called perturbation, which temporarily modifies the response of the amplifier and is performed by the placement of dielectric chips 139 on one or more of the matching stubs 180. These perturbations, moreover, are performed one at a time with the resulting response of the DUT 179 being measured with respect to current, power output, etc. with the resulting data being stored in the computer 161. This is then followed by a tuning process which consists of implementing a set of instructions from an optimization algorithm implemented by the computer 161 which specifies what is to be done physically to one or more of the circuit tuning stub 180' i.e. to trim or add physical length to the elements 180' by way of metallization applied thereto.

This now leads to consideration of the flowchart shown in FIG. 4A which is intended to broadly depict a computer implemented testing procedure which comprises a test routine stored in the computer 161 and is shown by reference numeral 200. As indicated by reference numeral 202, the test routine 200 turns on the RF sweeper 164 and generates a plurality (n) of test frequencies, typically n=3 frequencies. Next the input power as controlled by the power supply 168 through the interface bus 161' sets the input power to the DUT 179 to a constant value as shown by step 204 with the power being measured by the two digital power meters 172 and 172' with the data indicative of being coupled back to the computer 161 through the interface bus 161'.

Next as shown by block 206, the current drawn by and the power output of the DUT 179 for each frequency is measured. Current measurement is achieved by means of measuring the voltage drop across a shunt resistor, not shown, connected in series with the power supply 174 by the digital voltmeter 175. This value is coupled back to the computer 116 via the interface bus 161' connected to the digital voltmeter 175. Power output is measured by the digital power meter 183, with the data values thereof being coupled back to the computer 161 via the interface bus 161'. Following this as shown by reference numeral 208, the current and power values measured are stored in the computer's storage. The current data, together with an input and output power data, are used to compute the circuit efficiency of the DUT 179 for each frequency as shown by block 210 and is accomplished by a stored routine in the computer 161. The computer 161, moreover, obtains data on power output gain and efficiency of the DUT 179 at any time upon request.

Thus an operator starts the test routine 200 which runs all the frequencies of interest as directed by the computer 161 and acquires data on input/output reflected power and current drawn as described above. Accordingly, these data describe the performance i.e. response of the DUT 179. A query is then made as shown by reference numeral 212 to determine whether the test routine has been run for all the required frequencies. If the answer is affirmative, the RF sweeper 164 is turned off as shown in the block 214; otherwise, the routine cycles back to the initial step 202.

Following an initial determination of the circuit response characteristics, a perturbation routine 300, as shown in FIG. 4B, is run. This, however, presupposes an initial test routine 200 shown in FIG. 4A from which an initial computation 302 is made of the actual DUT response from which a comparison is made in step 304 against a predetermined stored response as to whether or not the response error is within a predetermined range. If the answer is affirmative, the DUT 179 in effect passes the test and all further operations stop. Otherwise, perturbations are performed one at a time with the resulting response being measured as described above with respect to current power, etc. As shown by reference numeral 306, the computer 161 directs the robot 176 under the control of the controller 178 to place and hold a chip 139 on a predetermined $i_{th}$ matching element or stub 180.

Dielectric chips 139' and 139" are used as tools for providing gradient information utilized in the perturbation routine 300 to implement a gradient algorithm comprising the ratio of the change in amplifier performance as measured by the power output of the DUT 179 as a function of the change in the effective lengths of the matching elements, i.e. stubs 180. A perturbation change comprises a relatively small change and this effect is provided by the dielectric chip which acts to effect a change in stub length.

The robot 176 is taught the location of the circuit tuning elements 180 via a layout of the circuit residing in the computer. This is generated using a readily obtainable graphic software package, for example, "AutoCad ®". Registration or fiducial marks 179' are formed, such as by etching, on the frame 179 at the lower left hand corner and the upper right hand corner of the DUT 179 and are used to identify the location of the matching and tuning elements 180 and 180' in relation to the computer circuit layout. The fiducial marks 179' sensed by means of the video camera 184 are coupled to the controller 178 which feeds the data back to the computer 161. Each matching and tuning element 180 and 180' is assigned a number. Once the perturbation routine 300 is initiated, the robot 176 is directed by the computer 161 through the controller 178 to access a particular matching element or stub 180 by number and place at least one dielectric chip 139 down onto the element and hold it in place until the power and current data is acquired and by rerunning the test routine as shown in FIG. 4A and as indicated by reference numeral 308. This placement of the dielectric chip and rerunning the test routine is repeated for each of the matching elements 180.

When all of the elements are perturbed as shown by reference numeral 310, the perturbation routine is terminated and a tuning routine is called to determine what type and how much tuning is required. This is shown in FIG. 4C and is identified by reference numeral 400.

Referring now to FIG. 4C, the tuning routine implements an algorithm and comprises an error minimization routine that uses the data obtained via the test routine run during the perturbation routine at step 308 and determines what change is necessary with respect to the circuit tuning elements 180' opposing respective matching stubs 180 to minimize the difference between the actual circuit response and the desired circuit response. The algorithm has for its objective the generation of a set of instructions for revising the lengths of one or all of tuning elements 180' either by shortening or increasing the respective lengths thereof.

Figure 8:
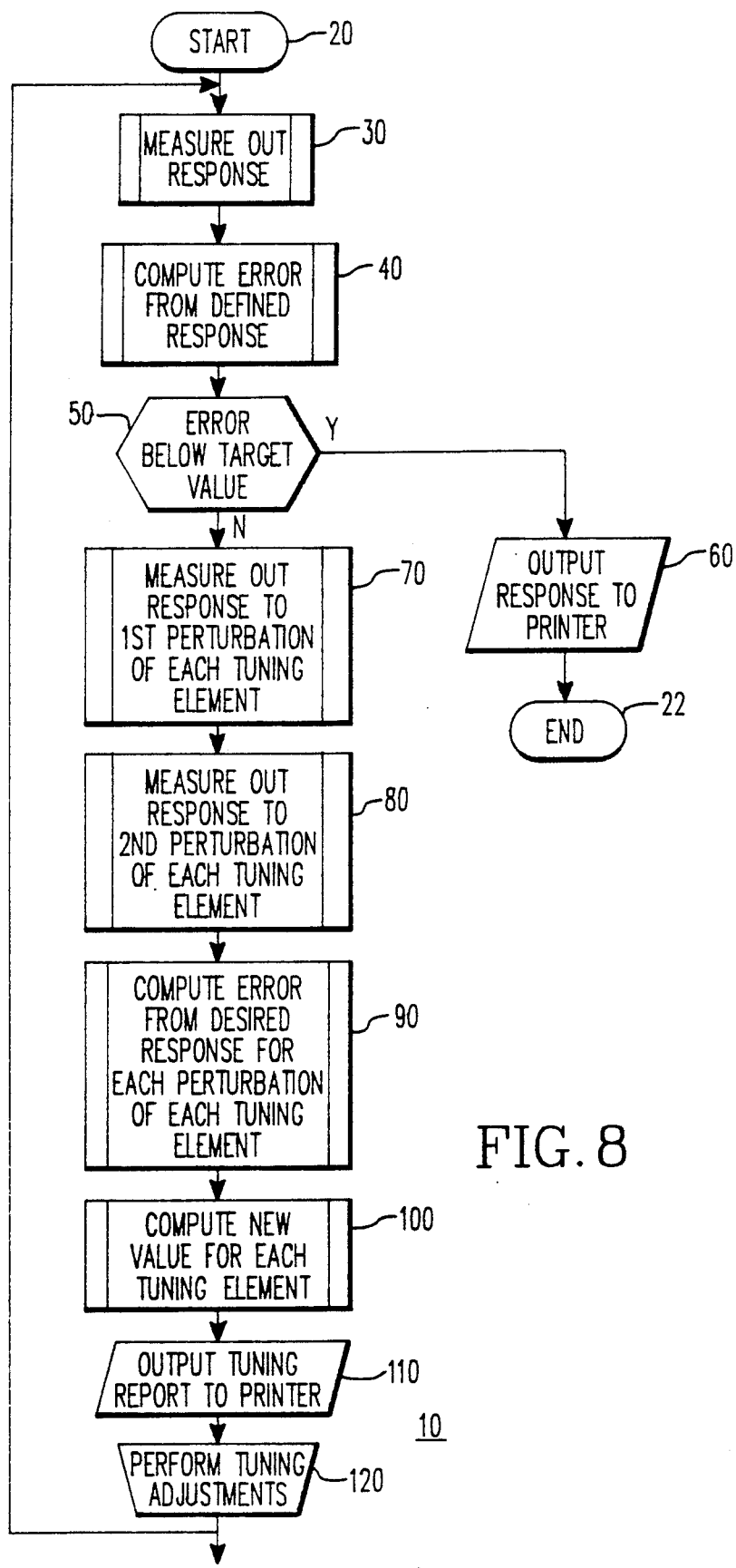
FIG. 8 is a flowchart further illustrative of the testing, perturbation and tuning operation incorporating the optimization algorithm according to the subject invention.
Figures 8A, 8B:
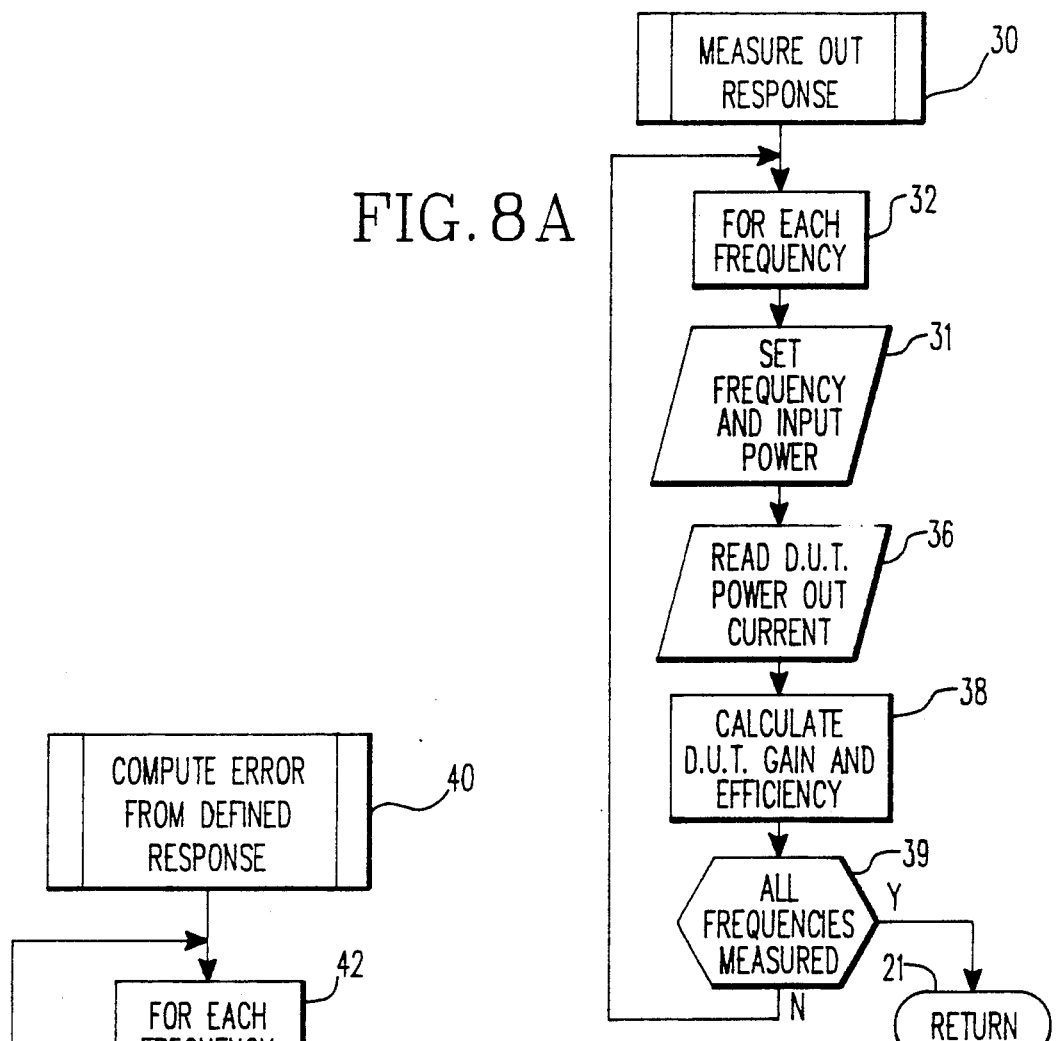
FIG. 8A is a flowchart of the method utilized to measure the response of the device under test.
FIG. 8B is a flowchart of the error computation routine.
Figures 8C, 8D:
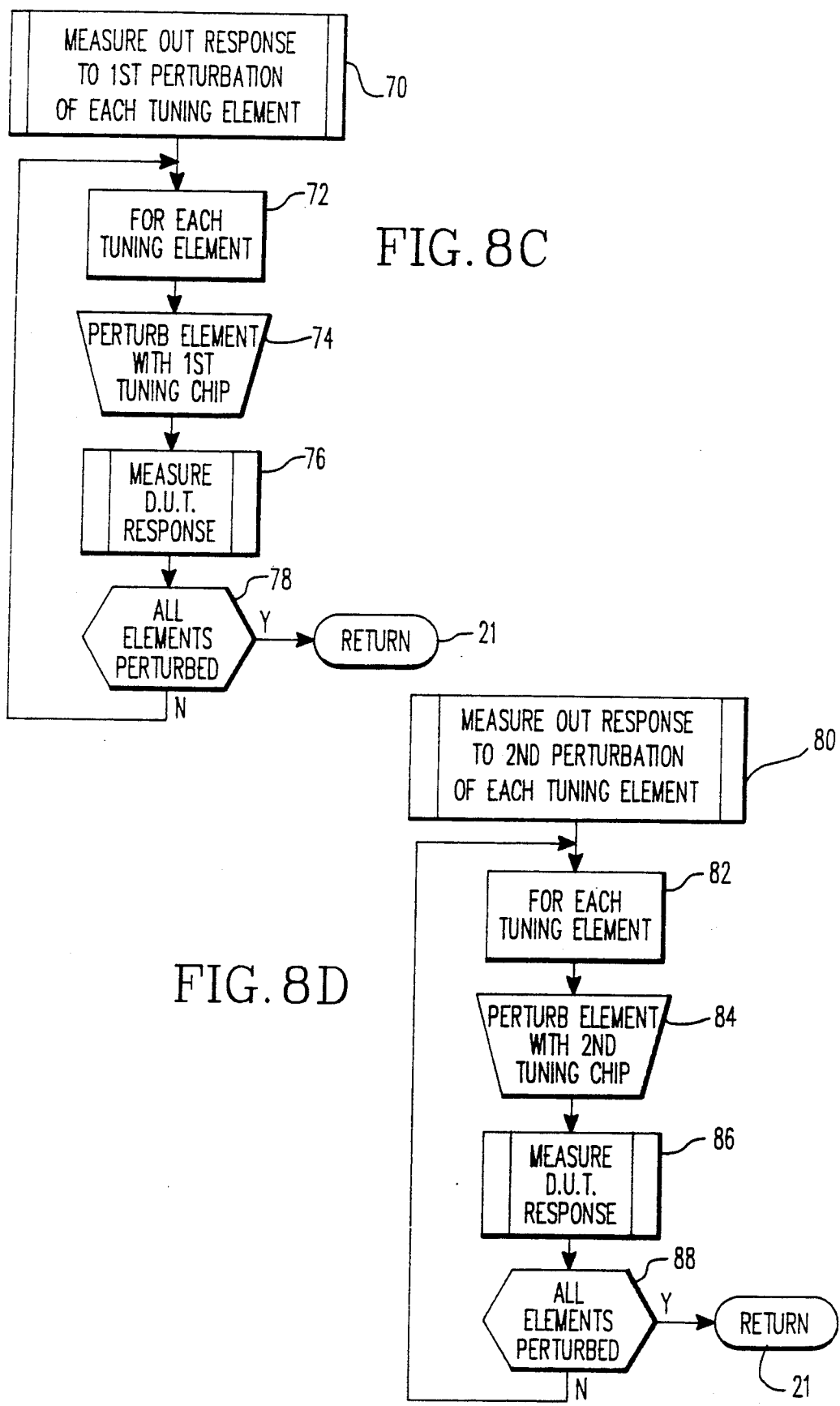
FIG. 8C is a flowchart of the first perturbation measurement routine.
FIG. 8D is a flowchart of the second perturbation measurement routine.
Figure 8E:
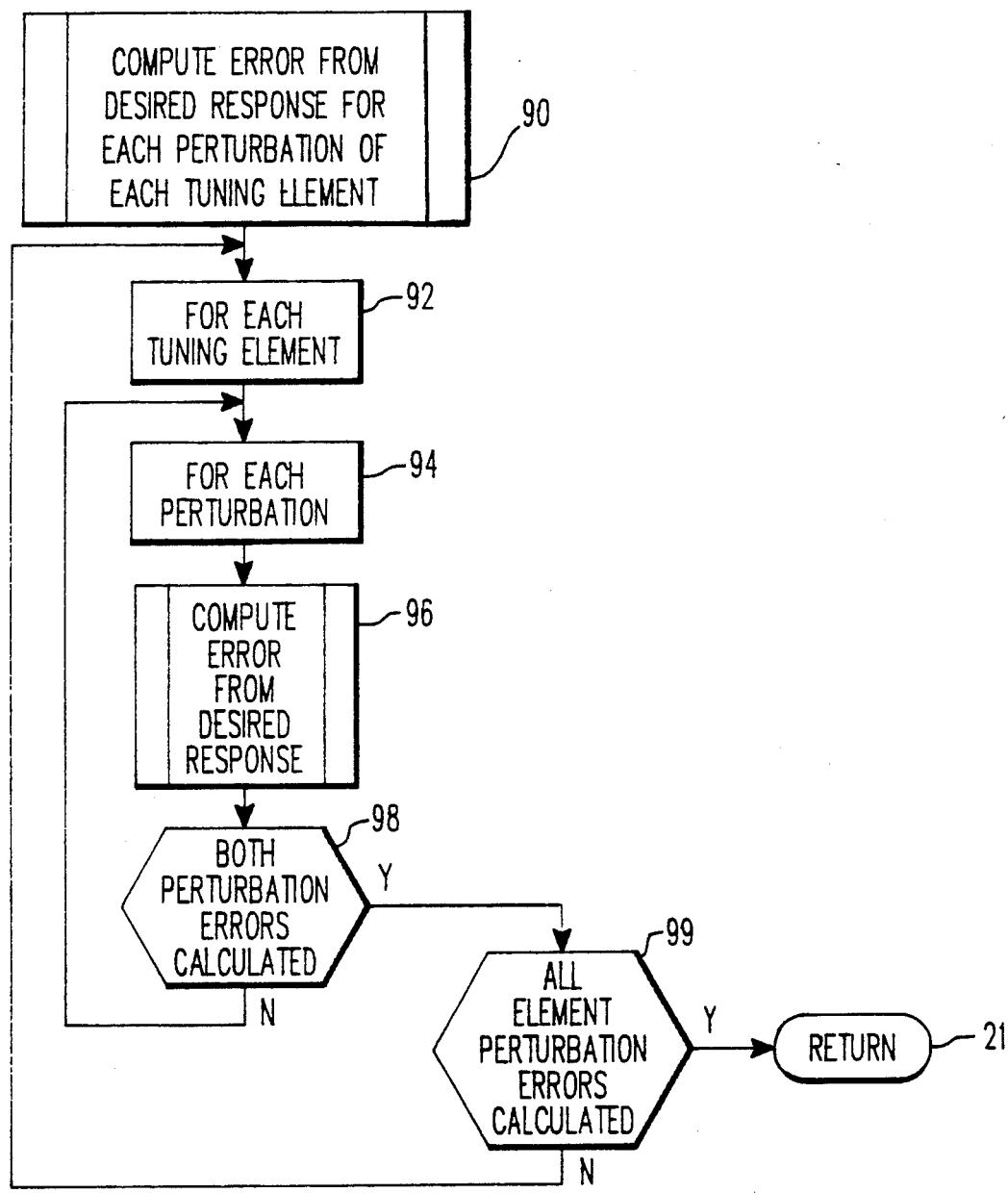
FIG. 8E is a flowchart of the first and second perturbation error routine.
Figure 8F:
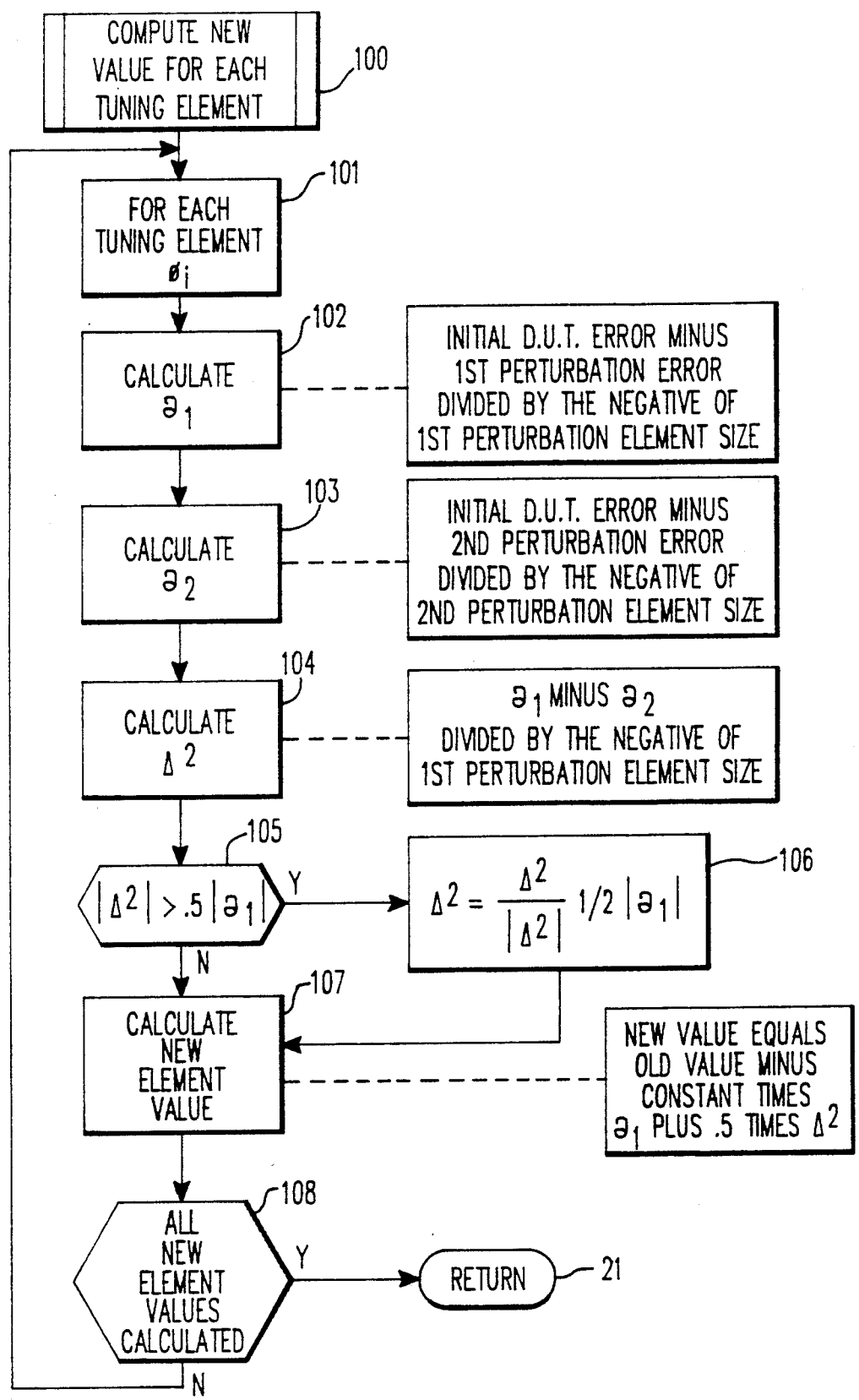
FIG. 8F is a flowchart of the tuning element calculation routine.

As shown by reference numeral 402, the tuning routine 400 first determines tuning values which are required for each tuning element 180' and implements a set of instructions, the details of which are outlined in FIG. 8F, which specify what is to be done physically to each element, i.e. whether to trim or add element length. These instructions are implemented one at a time after the DUT 179 has been turned off, for example as shown by step 214 in FIG. 4A. As indicated by reference numeral 404, a query is made for each element as to what is required for each element. If trimming is required, the x-y table 181 is moved to the proper location via the video camera 184 and instructions directed thereto from the computer 161 via the interface bus 161' to the proper location where the controller 178 instructs the laser 182 to trim the element length by a prescribed amount. This is shown by step 406. If no trimming is required but an additional length is needed, the computer 161 instructs the robot 176 through the controller 178 to add a predetermined length to the tuning element by applying metallized paint to a respective tuning element 180'. The laser 182 is also directed via the video camera 184 and the controller 178 and its position is related to the fudicial marks 179' on the DUT 179 which is also recognized by the camera 184.

The power settings of the laser 182 depend on the circuit substrate and the plating on the conductive material itself. The robot 176 is used to lengthen the tuning elements whenever the algorithm calls for a length addition to a particular tuning element 170'. This task is accomplished via the same coordinate finding routine used in step 306 of the perturbation routine shown in FIG. 4B with the exception that it is moved to the opposite side of the DUT 179 to be in registration with the appropriate tuning element 180' rather than the matching stub 180. The length addition is accomplished by bridging the gaps between the end of the stub 135 (FIG. 2) and the metallized pads 136 also shown in FIG. 2.

Accordingly, the technique for performing this chip size to stub length conversion is iterative and data is interpolated for a small length equivalency for a particular chip size. Thus, for example, if the output power of the DUT 179 varies by five watts with a dielectric chip size of 100×100 mils, it would indicate, for example, that a 5 mil extension in length is required for the tuning element on the opposite side and is done for each of the tuning stubs 180' as required to change the output response until it conforms to a required figure as shown by reference numerals 302 and 304 in FIG. 4B, at which point the process terminates, meaning that the DUT 179 is within the specifications designed for its particular use.

An alternative approach to that as described above is a circuit perturbation wherein the laser 182 generates circuit perturbations in the form of minute cuts in the lengths of tuning stubs 180'. Less than 5 mils per cut would be sufficient to effect the measured circuit performance parameter to correspond to gradients of the circuit performance in relation to the lengths of the tuning stubs 180'. In this embodiment to achieve laser trimming the stubs 180' would have to be designed to be longer than they would ultimately need to be to tune the circuit. Their length would be estimated by the circuit designer prior to manufacture. A modification to the tuning algorithm 10 as shown in FIG. 8 to accommodate laser perturbations would include cross partial derivative terms because each perturbation by laser 182 cutting would be irreversible for the individual elements.

The iterative nature of the convergence process in an optimization algorithm often causes the variables to fluctuate near the optimum. The computer-aided tuning technique of this invention, however, makes this iterative adjustment possible by providing for the addition and removal of metallization since the variables, i.e. element lengths, can be adjusted either way. The laser trimming technique normally does not allow for the possibility of tuning element correction, since it does not provide for increase in the lengths of the tuning stubs (unless the robot 176 is used to add metallization as pointed out above). However, this problem can be solved by cutting the tuning elements one at a time, from what is specified by the tuning algorithm, and monitoring the response of the circuit after each tuning element is thus trimmed. If enough cutting iterations are performed, it is possible to stop the trimming of a particular tuning element to the length specified by the tuning algorithm. The penalty that is paid for using this type of trimming technique is that the circuit response during the cutting must be monitored, which implies that additional number of circuit measurements are required, and also the trimming itself requires additional laser cutting/x-y table operations. These operations add to the time needed to perform the tuning task; however, since circuit measurements are performed in a matter of seconds and the x-y table moves at a comparable speed, the time for extra iterations using the laser tuning technique is much less than what it would take to iterate the foil placement in manual tuning, which is in the order of several minutes per tuning stub. It is estimated that a better than 4 to 1 reduction in tuning time for the automated laser tuning technique as compared to the computer-aided technique with automated circuit perturbations and manual foil placement.

Figure 5:
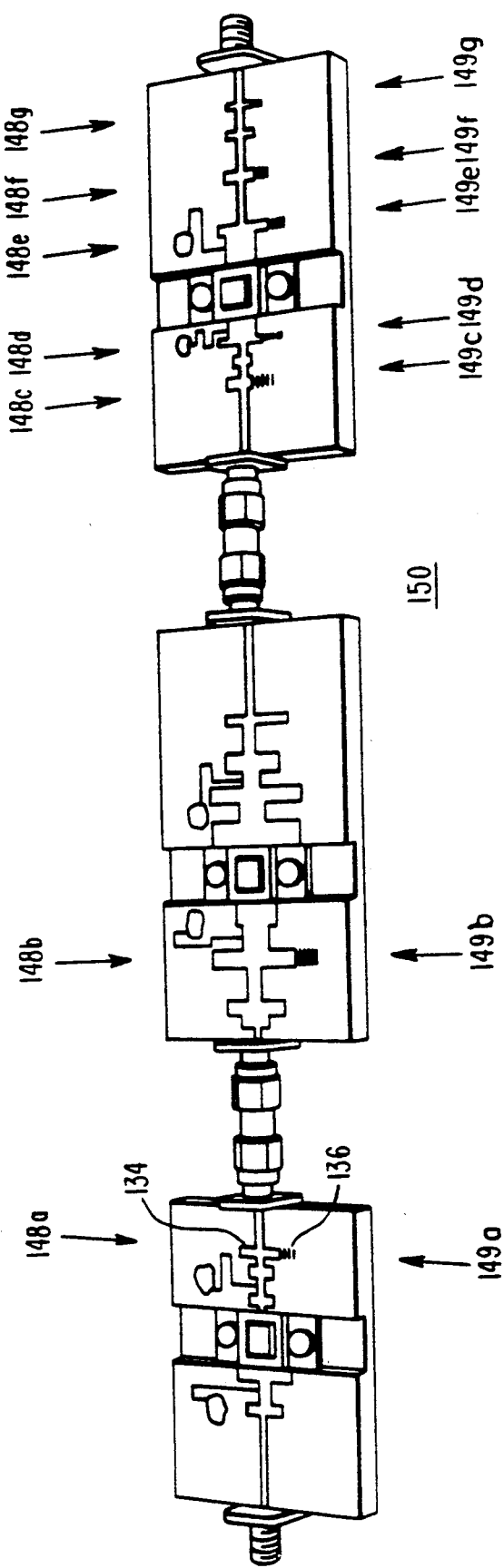
FIG. 5 is a plan view of a three stage S band amplifier with exposed perturbation stubs.

FIG. 5 is a plan view of an actual three stage S band amplifier 150 showing exposed perturbation stubs 148a, 148b, 148c, 148d, 148e, 148f and 148g. The manual tuning method of microwave microstrip amplifiers of the prior art consists in bridging extensions 149a, 149b, 149c, 149d, 149e, 149f and 149g, which are etched onto the circuit for the purpose of tuning with indium foil. This indium foil tuning extension of elements 149a-149g, adheres to the circuit and yet they can be easily removed during a manual iterative tuning process. When the indium foil tuning extensions are finalized, they are replaced with tin plated copper foil which is then soldered into the circuit in the exact same locations as foil extensions 149a-149g.

Figure 6:
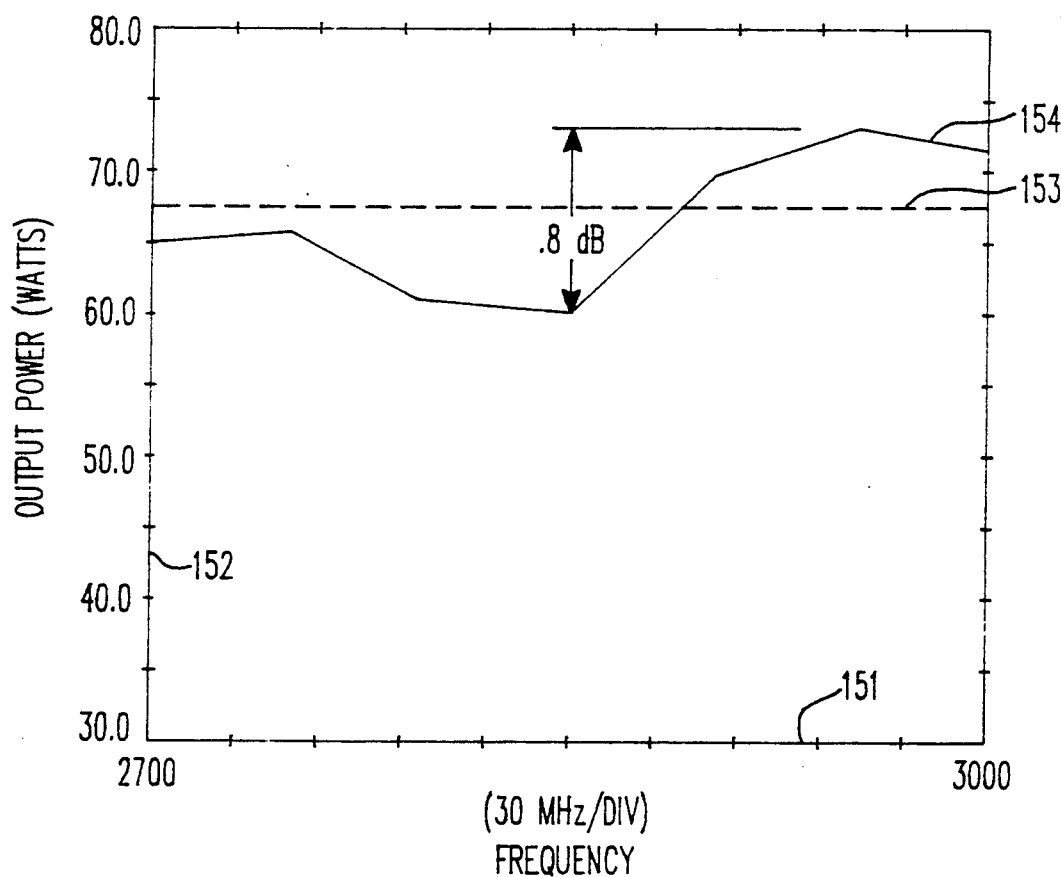
FIG. 6 is a graph of the original response results as seen in output power (watts) versus frequency (MHz) for the S band amplifier.

FIG. 6 is a graph of the frequency 151 versus output power 152 for an amplifier as shown in FIG. 5. A predetermined specified minimum output power of 67 Watts, is shown by the dotted line 153. The actual performance of output power over the range of frequencies is the solid line 154. As can be seen from FIG. 6, which is a graph of an untuned amplifier, there is at the greatest point of variance a drop in gain of 0.8dB. A chart of the original, untuned, non-linear response is as follows:

TABLE 1

| UNTUNED RESPONSE OF AN S-BAND AMPLIFIER | | | |
|---|---|---|---|
| Frequency MHz | Untuned Gain dB | Power Out Watts | Power In (Fixed) Watts |
| 2700 | 19.3 | 65.3 | .8 |
| 2750 | 19.4 | 66.2 | .8 |
| 2800 | 19.0 | 60.8 | .8 |
| 2850 | 19.0 | 59.8 | .8 |
| 2900 | 19.6 | 69.3 | .8 |
| 2950 | 19.8 | 72.3 | .8 |
| 3000 | 19.7 | 70.6 | .8 |

Figure 7:
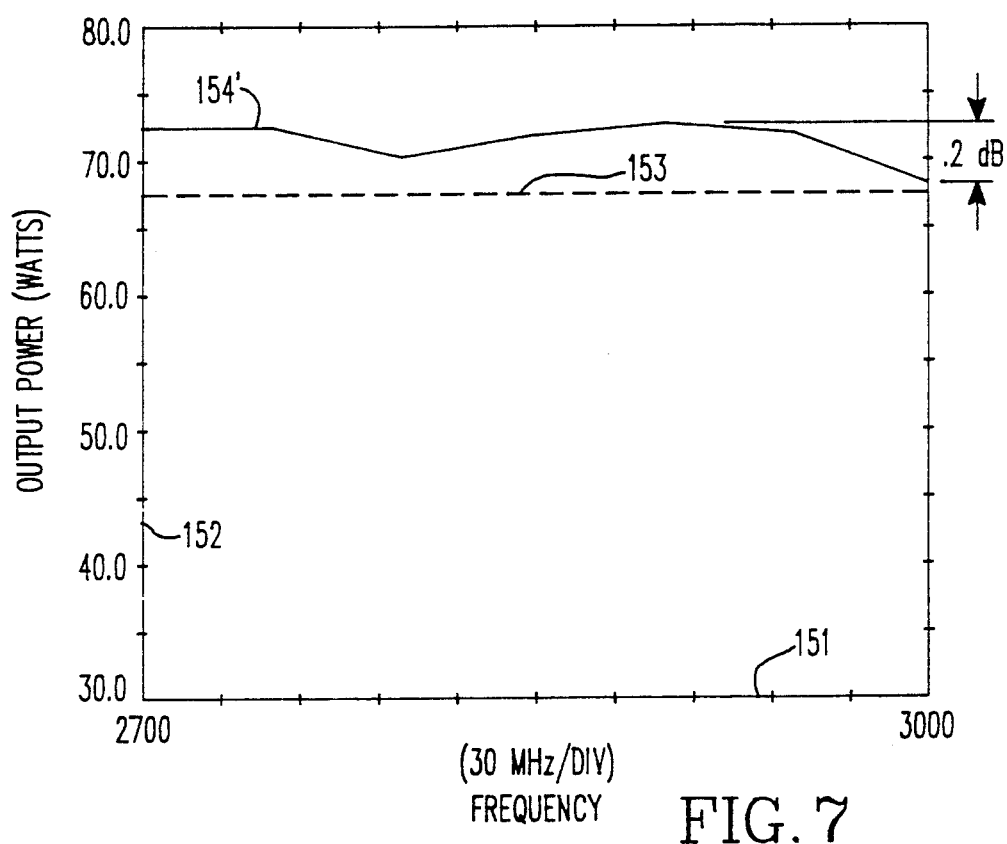
FIG. 7 is a graph of the response results after tuning utilizing the optimization algorithm as a graph of output power (watts) versus frequency (MHz)

However, after the application of a tuning method in accordance with this invention there is a marked improvement in amplifier performance as shown in FIG. 7.

FIG. 7 is a graph of the output power versus frequency for a tuned amplifier as opposed to that shown in FIG. 6. Again, a predetermined specified minimum output power requirement of 67 watts, is shown by dotted line 153. The actual output power performance over the full range of frequencies is shown as solid line 154'. As can be seen in FIG. (7), a graph of the tuned amplifier using the automated tuning algorithm and method as referred to briefly above, the variance has been decreased to a gain drop of 0.2dB. A chart of the tuned amplifier, at specific frequencies is as follows:

TABLE 2

| TUNED RESPONSE OF S-BAND AMPLIFIER | | | |
|---|---|---|---|
| Frequency MHz | Gain dB | Power Out Watts | Power In (Fixed) Watts |
| 2700 | 19.8 | 72.3 | .8 |
| 2750 | 19.8 | 72.3 | .8 |
| 2800 | 19.7 | 70.3 | .8 |
| 2850 | 19.8 | 71.8 | .8 |
| 2900 | 19.8 | 72.6 | .8 |
| 2950 | 19.8 | 71.9 | .8 |
| 3000 | 19.6 | 68.4 | .8 |

FIG. 8 is a more detailed flowchart of the proposed iterative type testing, perturbations and tuning procedure 10 incorporating the optimization algorithm with repeated test, perturbation and tune iterations. Upon starting 20 the testing, perturbing and tuning procedure 10, the overall circuit specification requirements in terms of, for example, specific frequency points versus output power are defined. The DUT 137 shown in FIG. 4 is subjected to a an initial response measurement routine 30. After these original values are determined in step 30, the error computation routine 40 calculates the error E, for example, for each frequency. If the error computed in step 40 is less than the overall circuit specification requirements then the output response is reported to the printer 60 and the procedure ends 22.

However, if the response error E computed in step 40 is greater than the overall circuit specification requirements for each tuning element in the circuit, then a first physical perturbation 70 is implemented. Then a second perturbation 80 is performed for each tuning element 180' and the complete error from the required response is calculated 90. The error calculations are optimized in the minimization algorithm such that a new value for each tuning element in the circuit can be calculated 100. An output tuning report 110 is made to the printer, whereupon the robot 176 or laser 182 performs the necessary tuning adjustments 120 to each element 180' in the circuit. After the tuning adjustments have been performed under step 120, the entire process as shown in FIG. 8 is repeated until the error E measured as per step 50 is within an acceptable range of error comparison to the circuit's specified requirements. At such time as the answer to the question of step 50 is negative (N), then the overall process will iteratively repeat because the overall circuit response is outside of the prespecified tolerance. At step 60 an affirmative response (Y) means that the overall circuit response meets system specifications.

FIG. 8A is a flowchart of the method 30 utilized to measure the response of the device under test 179. In this specific example of an amplifier, for each frequency 32 the frequency is set for a specific input power 31. The device under test is subjected to an output power and supply current measurement in step 36. In this example, the gain and efficiency of the device under test is calculated by step 38 and a verification of all the frequencies measured is performed in step 39. If all the frequencies are evaluated the measure of the device under test routine 30 returns 21 to the overall method 10.

FIG. 8B is a flowchart of the error computation routine 40. Again, for each frequency 42 an error E calculation 44 is performed:

$$E = W(U_o - U_j)^2$$

where:
W = A weighted factor
$U_o$ = Desired or specific response
$U_j$ = The actual response of the device under test In step 46 the root mean square (rms) value of the error is added to the total error, for all error points. If all of the errors have been calculated for all frequencies as per step 47, then the error E for the entire circuit at all frequencies is calculated in step 48 as:

$$E = \frac{1}{n} \sqrt{\text{TOTAL ERROR}},$$

resulting in the average error across all frequencies. After this calculation in step 48 the error computation routine will return 21 to the overall method 10 (FIG. 8). If in step 47 all of the errors n have not been calculated, then the error computation routine 40 will repeat for each frequency at step 42.

FIG. 8C is a flowchart of the first perturbation measurement routine 70. Wherein, for each tuning element in step 72, for example a first physical perturbation will occur to the tuning elements with a first dielectric chip 139', for example. After this perturbation with the first dielectric chip in step 74, a measurement is made in step 76 of the response of the device under test 179. In step 78 a verification of the perturbation of all the elements 180 occurs. If all of the elements have been perturbed then the first perturbation measurement routine 70 returns 21 to the overall testing and tuning method 10 as shown in FIG. 8. If step 78 determines that all of the perturbable elements 180 have not been perturbed then the first perturbation measurement routine 70 repeats itself at step 72.

FIG. 8D is a flowchart of the second perturbation measurement routine 80. This second perturbation routine 80, for each element, 82, perturbs the elements with a second dielectric chip 139'', for example, as shown in step 84. The step 86 measures the perturbed devices output. Step 88 of this measurement routine 80 verifies if all of the elements have been perturbed. If all of the elements have been perturbed, as per step 84 then the second perturbation measurement routine 80, returns to the overall testing, perturbation and tuning method 10 (FIG. 8).

FIG. 8E is a flowchart of the method of error calculation 90 for the first and the second error routines. This error calculation method 90 is performed for each tuning element 92, for each perturbation wherein the error is computed from the ideal or the required response 96 and for the first and the second perturbations the errors or difference between the ideal response and the actual response is calculated 98. A verification step 99 of this first and second perturbation error method 90 ascertains whether all the individual elements 180 have had their perturbation error calculated. If all errors have been calculated as per this routine 90, then the first and second error method returns 21 to the overall testing and tuning method of FIG. 8.

FIG. 8F is a flowchart of the tuning element calculation routine 100. In step 101, for each tuning element $\phi_i$, having an element length of $l_{\phi i}$ a first partial derivative $\partial_1$, in step 102 is calculated as the initial device under test error minus the first perturbation error divided by the negative of the first perturbation element size, or as shown in step 102:

$$\partial_1 = \frac{\partial E}{\partial l_{\phi i}}$$

Step 103 of FIG. 8F shows the calculation of the second perturbation error $\partial_2$, as the initial device under test error minus the second perturbation error divided by the negative of the second perturbation element size, or as shown for step 103:

$$\partial_2 = \frac{\partial E}{\partial l_{\phi i}}$$

Step 104 demonstrates the calculation of the difference between these two partial derivatives $\partial_1$ and $\partial_2$, $\Delta^2$, where:

$$\Delta^2 = \frac{\partial^2 E}{\partial l_{\phi i}^2}$$

or $\partial_1 - \partial_2$ divided by the negative of the first perturbation element size. If the absolute value of $\Delta^2$ is greater than one-half of the absolute value of $\partial_1$ then, $$\Delta^2 = \frac{\Delta^2}{|\Delta^2|} \times \tfrac{1}{2}|\partial_1|$$

and a new value is calculated for the new element. Or, when the new value equals the old value, minus a constant times $\partial_1$ plus one-half times $\Delta^2$ then all the values for the new elements will be calculated.

The flowchart for the tuning element calculation in FIG. 8F can be described mathematically as for the error function E(U):

$$E(U) = \frac{1}{n} \left( \sum_{A=1}^{n} W_A[Uo(f_A, \phi_i) - Uj(f_A, \phi_i)]^2 \right)^{\frac{1}{2}}$$

where;
j = For each iteration
$\phi_i$ = Each tuning element
n = Number of individual test points
Uo(f,) = The original circuit response function
Uj(f,) = The circuit response for iteration j
$f_1...f_n$ = Critical frequencies
$W_1...W_n$ = Weighting factors
$l_j$ = Length of tuning element $\phi_i$, at jth iteration
$\beta$ = Error target value or performance iteration.

If E(U) is less than or equal to the error target value then the iterations stop. If, however, E(U) is greater than the error target value, then the iterations will continue until optimization occurs. For each tuning element $\phi_i$:

$$l(j+1)\phi_i = l(j)\phi_i - K\left[\frac{\partial E}{\partial l_{\phi_i}} + \frac{1}{2}\frac{\partial^2 E}{\partial l_{\phi_i}^2}\right]$$

where:

$0 < K < 1$

K = A number chosen during the design of the overall circuit based on the designers' prior experience with the number of tuning iterations previously required to reach optimization.

Finally, if:

$$\frac{\partial^2 E}{2 l_{\phi_i}^2} > \frac{1}{2}\left|\frac{\partial E}{2 l_{\phi_i}}\right|$$

An assigned value for $$\frac{\partial^2 E}{\partial l_{\phi_i}^2}$$

must be calculated which is:

$$\frac{\partial^2 E}{\partial l_{\phi_i}^2} = \frac{\frac{\partial^2 E}{\partial l_{\phi_i}^2}}{\left|\frac{\partial^2 E}{\partial l_{\phi_i}^2}\right|} \times \frac{1}{2}\left|\frac{\partial E}{\partial l_{\phi_i}}\right|$$

Numerous variations may be made in the above-described combination, and different embodiments of this invention may be made without departing from the spirit thereof. Therefore, it is intended that all matter contained in the foregoing description and in the accompanying drawings shall be interpreted as illustrative and not in a limiting sense.

We claim:

1. A fully automated iterative method performed under the control of a computer apparatus having a desired signal response characteristic stored therein for the post production testing, perturbation and tuning of a stripline amplifier circuit, comprising the steps of:
   a. measuring an actual signal response of said amplifier circuit for each of a predetermined number of operational frequencies;
   b. determining a signal response error between the desired signal response characteristic stored in said computer apparatus and the actual signal response measured for each of said predetermined number of operational frequencies;
   c. determining an average response error of the total signal response error for all of said predetermined number of operational frequencies;
   d. terminating the method if said average response error is within a predetermined range of values, otherwise
   e. robotically positioning said stripline amplifier circuit and perturbing at least one circuit element of said stripline amplifier circuit in accordance with a gradient algorithm for producing a change of the actual signal response;
   f. repeating steps (a) and (b);
   g. determining at least one perturbation signal response for each of said predetermined number of operational frequencies;
   h. determining a perturbation signal response error from said desired signal response for each of said predetermined number of operational frequencies;
   i. determining a required dimensional change in at least one tuning element for minimizing said perturbation signal response error;
   j. robotically repositioning said stripline amplifier circuit and thereafter robotically increasing or decreasing a dimension of said tuning element for tuning said amplifier circuit until the actual signal response error thereof is within an acceptable value relative to said optimum signal response.

2. The method of claim 1 wherein said steps of positioning and repositioning comprise electronically determining the position of computer controlled support means for supporting said stripline amplifier circuit and moving said support means under computer control to a predetermined position corresponding to the location of said one circuit element and said tuning element.

3. The method of claim 2 wherein said step of position determining comprises electronically sensing a set of indicia on said support means and generating positional feedback signals, said computer using said feedback signals for moving said support means to said one circuit element and said tuning element.

4. The method of claim 3 wherein said support means comprises a movable table, said indicia comprises a set of fiducial marks located on a surface of said movable table, and said step of electronically sensing comprises viewing the set of fiducial marks with a video camera.

5. The method of claim 2 wherein said at least one circuit element comprises a matching element associated with said tuning element and said perturbing step comprises the step of robotically changing the effective length of said matching element.

6. The method of claim 5 wherein said perturbing step includes the step of changing the effective length of said matching element a first and second time, and repeating steps (a) and (b) each said time.

7. The method of claim 6 wherein said matching element comprises a circuit stub and wherein said step of altering the effective length comprises robotically decreasing the effective length of said circuit stub by placing a dielectric chip thereon.

8. The method of claim 7 wherein said step of placing a dielectric chip comprises placing a different sized dielectric chip on said circuit stub each said time.

9. The method of claim 2 wherein said at least one circuit element comprises a tuning stub and said perturbing step comprises removing a selected portion from said tuning stub.

10. The method of claim 2 wherein said step of measuring includes at least three operational frequencies.

11. The method of claim 2 wherein said signal response error for each operational frequency comprises a root mean square value.

12. A computer controlled automated tune, perturb and test station for a stripline amplifier circuit;
   a. a computer means for controlling a stripline amplifier circuit under test in accordance with a predetermined optimization algorithm for achieving a desired signal response;
   b. said computer means further including means for storing a set of operating routines, an optimum signal response, and measurement data of the actual signal response of said circuit under test;
   c. frequency generator means coupled to and controlled by said computer means for producing continuous wave, relatively low power, radio frequency input signals of a plurality of different frequencies;
   d. pulse generator means for generating a pulsed video output signal;
   e. modulator means coupled to said frequency generator means and said pulse generator means and being responsive to said continuous wave input signals and said pulsed video output signal therefrom for generating a pulse of the continuous wave, low power, radio frequency input signal for each of said plurality of different frequencies;
   f. RF amplifier means coupled to said modulator and being responsive to said pulse of the input signal for generating a relatively high power, radio frequency input signal pulse;
   g. means for applying said input signal pulse to said circuit under test;
   h. robotic perturbing and tuning means including a robot, a video camera, and a laser;
   i. controller means controlled by said computer means through an interface bus for controlling said robotic means;
   j. a movable table for supporting said circuit under test and including position reference means located thereon for being sensed by said video camera, said table further being coupled to and controlled in response to control signals from said computer means for selectively positioning said circuit under test relative to said robot and said laser in response to output signals from said video camera being fed back to said controller means;
   k. means selectively provided by said robot and said laser for producing a physical perturbation of at least one circuit element of said circuit under test;
   l. means controlled by said computer means for providing measurement data of the current drawn by and outputted from said circuit under test for said plurality of different frequencies for determining the actual signal response to said input signal pulse of said different frequencies prior to and following said physical perturbation; and
   m. said laser and said robot being responsive to control signals from said controller means for respectively removing or adding discrete portions from and to at least one tuning element of said circuit under test for minimizing a difference between the actual signal response and the desired circuit response.

13. The station of claim 12 wherein said plurality of different frequencies comprises at least three frequencies.

14. The station of claim 13 wherein said at least one circuit element comprises a matching stub and said tuning element comprises a tuning stub.

15. The station of claim 14 wherein said matching stub and said tuning stub are located mutually opposite from one another at the same location of said stripline amplifier circuit.

16. The station of claim 13 wherein said at least one circuit element perturbed also comprises said tuning element.

17. The station of claim 16 wherein said laser produces a perturbation by making predetermined cuts in said tuning element.

18. The station of claim 15 wherein said robot produces a perturbation by placing a dielectric chip on said matching stub.

19. The station of claim 15 wherein said robot produces a perturbation by sequentially placing at least two dielectric chips of different sizes on said matching stub.

20. The station of claim 15 wherein said robot adds discrete portions by painting metallization on said tuning element.

21. The station of claim 15 wherein said laser removes discrete portions by cutting a portion of metallization from the length of said tuning element.

22. The station of claim 15 wherein said position reference means comprises a set of fiducial marks viewable by said video camera located on a surface of said movable table containing said circuit under test.

* * * * *